US010049804B2

(12) United States Patent
Pan et al.

(10) Patent No.: US 10,049,804 B2
(45) Date of Patent: Aug. 14, 2018

(54) ELECTRONIC DEVICE PACKAGE BOX

(71) Applicant: BOTHHAND ENTERPRISE INC., Tainan (TW)

(72) Inventors: Yung-Ming Pan, Taoyuan (TW); Chung-Cheng Fan, Taoyuan (TW)

(73) Assignee: Bothhand Enterprise Inc., Tainan (TW)

( * ) Notice: Subject to any disclaimer, the term of this patent is extended or adjusted under 35 U.S.C. 154(b) by 156 days.

(21) Appl. No.: 15/135,977

(22) Filed: Apr. 22, 2016

(65) Prior Publication Data

US 2017/0110232 A1    Apr. 20, 2017

(30) Foreign Application Priority Data

Oct. 20, 2015  (TW) .............................. 104134408 A

(51) Int. Cl.
*H01F 27/02* (2006.01)
*H01F 27/29* (2006.01)
*H05K 5/02* (2006.01)

(52) U.S. Cl.
CPC .......... *H01F 27/02* (2013.01); *H01F 27/027* (2013.01); *H01F 27/29* (2013.01); *H05K 5/0217* (2013.01)

(58) Field of Classification Search
USPC ..................................... 336/90, 83, 192, 229
See application file for complete search history.

(56) References Cited

U.S. PATENT DOCUMENTS

| 2007/0238359 | A1* | 10/2007 | Gutierrez | .............. | H01F 27/027 439/620.01 |
| 2008/0297294 | A1* | 12/2008 | Wang | .................... | H01F 27/027 336/90 |
| 2013/0178104 | A1* | 7/2013 | Lin | .......................... | H01R 9/22 439/626 |
| 2015/0173216 | A1* | 6/2015 | Nagashima | .............. | H05K 5/02 361/679.01 |

* cited by examiner

*Primary Examiner* — Elvin G Enad
*Assistant Examiner* — Kazi Hossain
(74) *Attorney, Agent, or Firm* — Muncy, Geissler, Olds & Lowe, P.C.

(57) ABSTRACT

An electronic device package box is adapted to be mounted with a plurality of electric coil components, and includes: a base unit having a first abutment surface and defining a receiving space therein for receiving the electric coil components; a cover unit removably covering the receiving space of the base unit and having a second abutment surface that abuts against the first abutment surface; a plurality of conductive pins mounted to the base unit and adapted to be electrically connected to the electric coil components; and an engaging unit including first and second engaging members respectively formed on the first and second abutment surfaces, the first engaging member being slidable relative to the second engaging member.

8 Claims, 5 Drawing Sheets

ELECTRONIC DEVICE PACKAGE BOX

CROSS-REFERENCE TO RELATED APPLICATION

This application claims priority of Taiwanese Patent Application No. 104134408, filed on Oct. 20, 2015.

FIELD

The disclosure relates to an electronic device package box, and more particularly to an electronic device package box that is adapted to be mounted with a plurality of electric coil components and that can be easily assembled and disassembled.

BACKGROUND

Referring to FIG. 1, a conventional electronic device package box 1 is adapted to be mounted with a plurality of electronic components 10. The electronic device package box 1 includes a base unit 11 supporting the electronic components 10 thereon, a plurality of spaced-apart connecting pins 12 electrically connected to the electronic components 10 and inserted into the base unit 11, and a cover unit 13 for covering the base unit 11. The base unit 11 and the cover unit 13 are bonded together by a layer of glue 14.

However, the glue-bonded base and cover units 11, 13 are difficult to be separated from each other. If separation of the two units is required, a tool has to be used to destroy the bonding between the base and cover units 11, 13, likely damaging the electronic device package box 1.

Referring to FIG. 2, another conventional electronic device package box 2 for mounting a plurality of electronic components 20 therein includes a base unit 21 for receiving the electronic components 20 therein, a plurality of spaced-apart connecting pins 22 electrically connected to the electronic components 20 and inserted into the base unit 21, a cover unit 23 removably covering the base unit 21, and a plurality of positioning units 24 for positioning the cover unit 23 to the base unit 21. Each of the positioning units 24 includes a first positioning member 241 formed on the base unit 21, and a second positioning member 242 formed on the cover unit 23. The first positioning member 241 of each of the positioning units 24 is snap-fitted to the corresponding second positioning member 242 when the cover unit 23 covers the base unit 21.

However, to separate the base unit 21 and the cover unit 23, a tool or a relatively large force might be used to disengage the first positioning member 241 and the corresponding second positioning member 242. Such disengaging process may be difficult to perform since the conventional electronic device package box 2 is typically mounted on a circuit board (not shown), and the distance between the second positioning member 242 of each of the positioning units 24 and the circuit board is relatively small.

SUMMARY

Therefore, an object of the disclosure is to provide an electronic device package box that can alleviate at least one of the drawbacks of the prior art.

According to a first aspect of this disclosure, the electronic device package box adapted to be mounted with a plurality of electric coil components includes a base unit, a cover unit, a plurality of conductive pins, and an engaging unit.

The base unit has a first abutment surface and defines a receiving space therein for receiving the electric coil components. The cover unit removably covers the receiving space of the base unit and has a second abutment surface that abuts against the first abutment surface. The conductive pins are mounted to the base unit and are adapted to be electrically connected to the electric coil components. The engaging unit includes a first engaging member formed on the first abutment surface of the base unit, and a second engaging member formed on the second abutment surface of the cover unit. The first engaging member is slidable relative to the second engaging member in a first direction so that the base unit is slidably connected to the cover unit.

Another object of the disclosure is to provide an electronic device that can overcome at least one of the aforesaid drawbacks of the prior art.

According to a second aspect of this disclosure, the electronic device includes the electronic device package box of the first aspect, and a plurality of electronic coil components received in the receiving space of the electronic device package box and electrically connected to the conductive pins of the electronic device package box.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
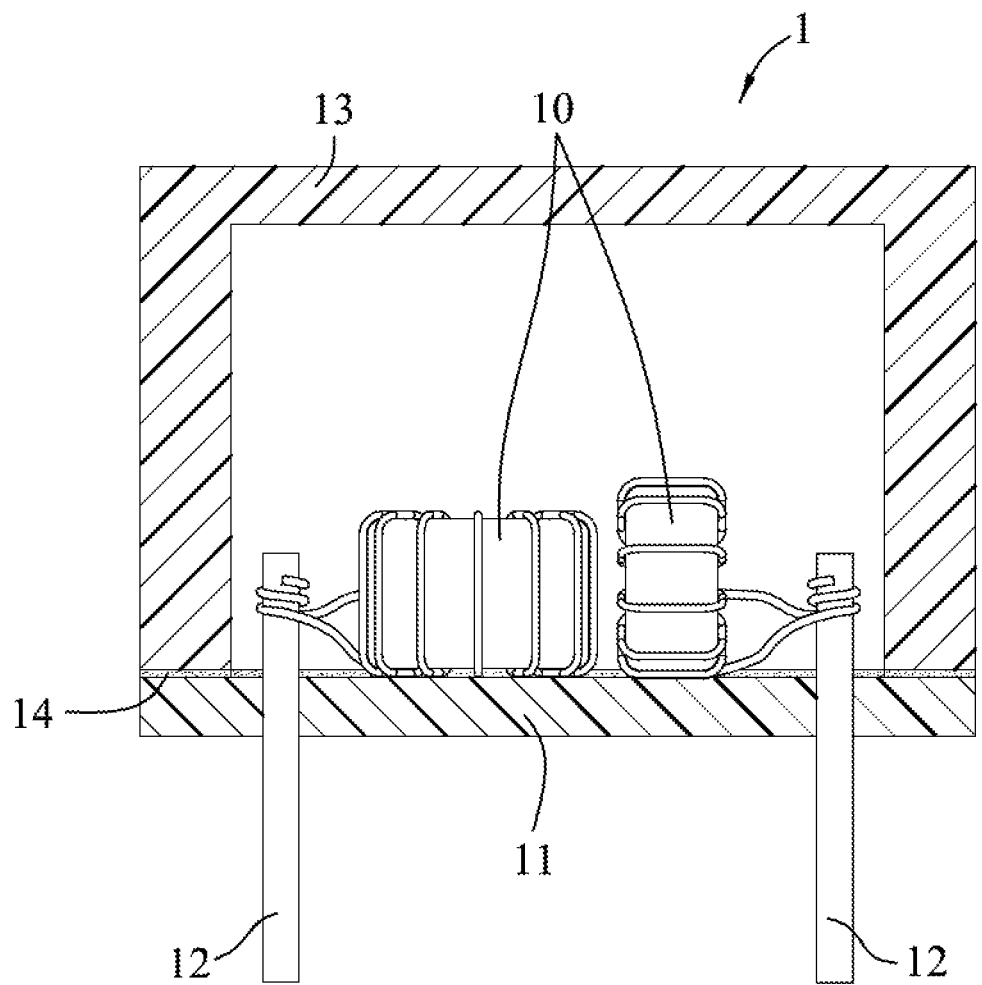
FIG. 1 is a partly cross-sectional view of a conventional electronic device package box.
Figure 2:
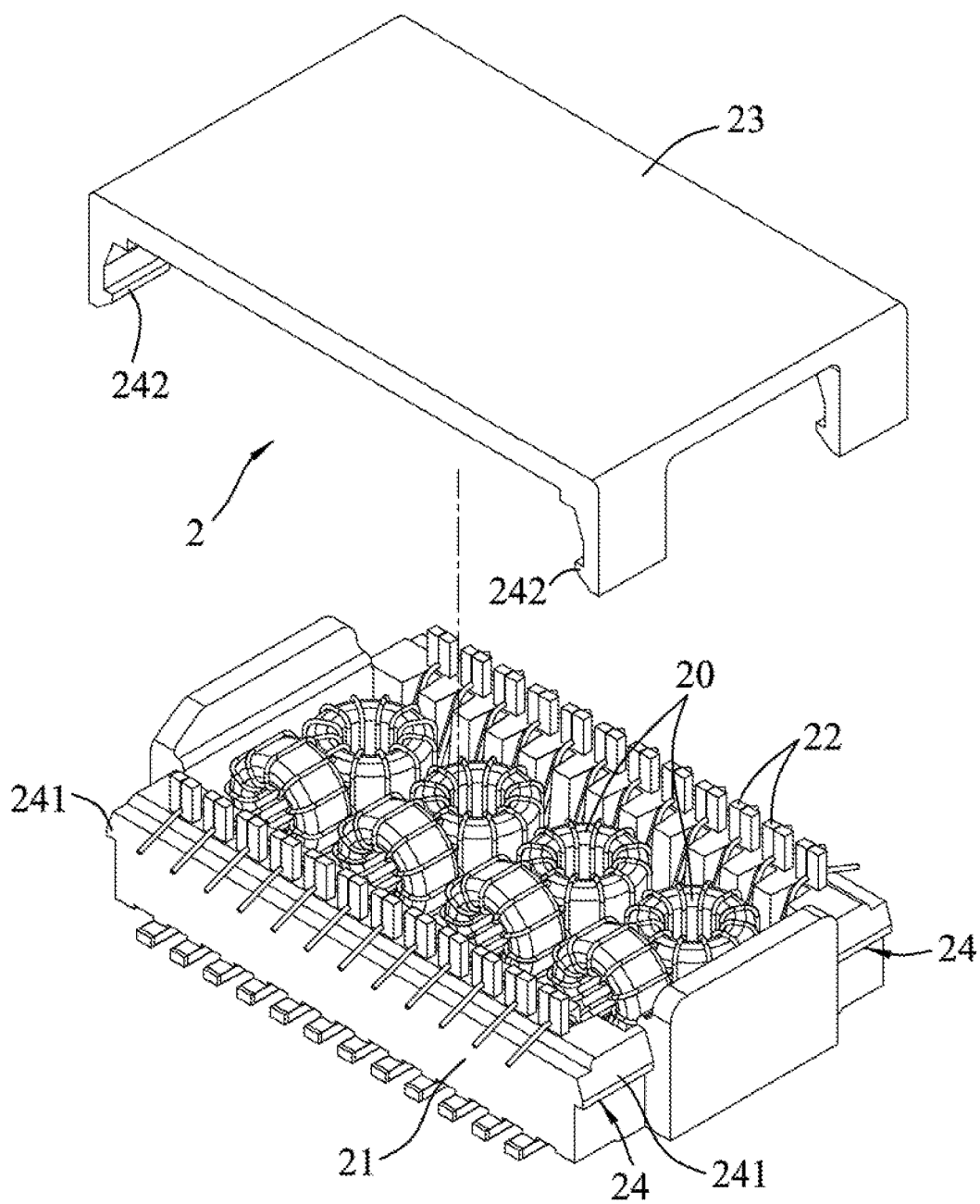
FIG. 2 is a partly exploded perspective view of another conventional electronic device package box.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 3:
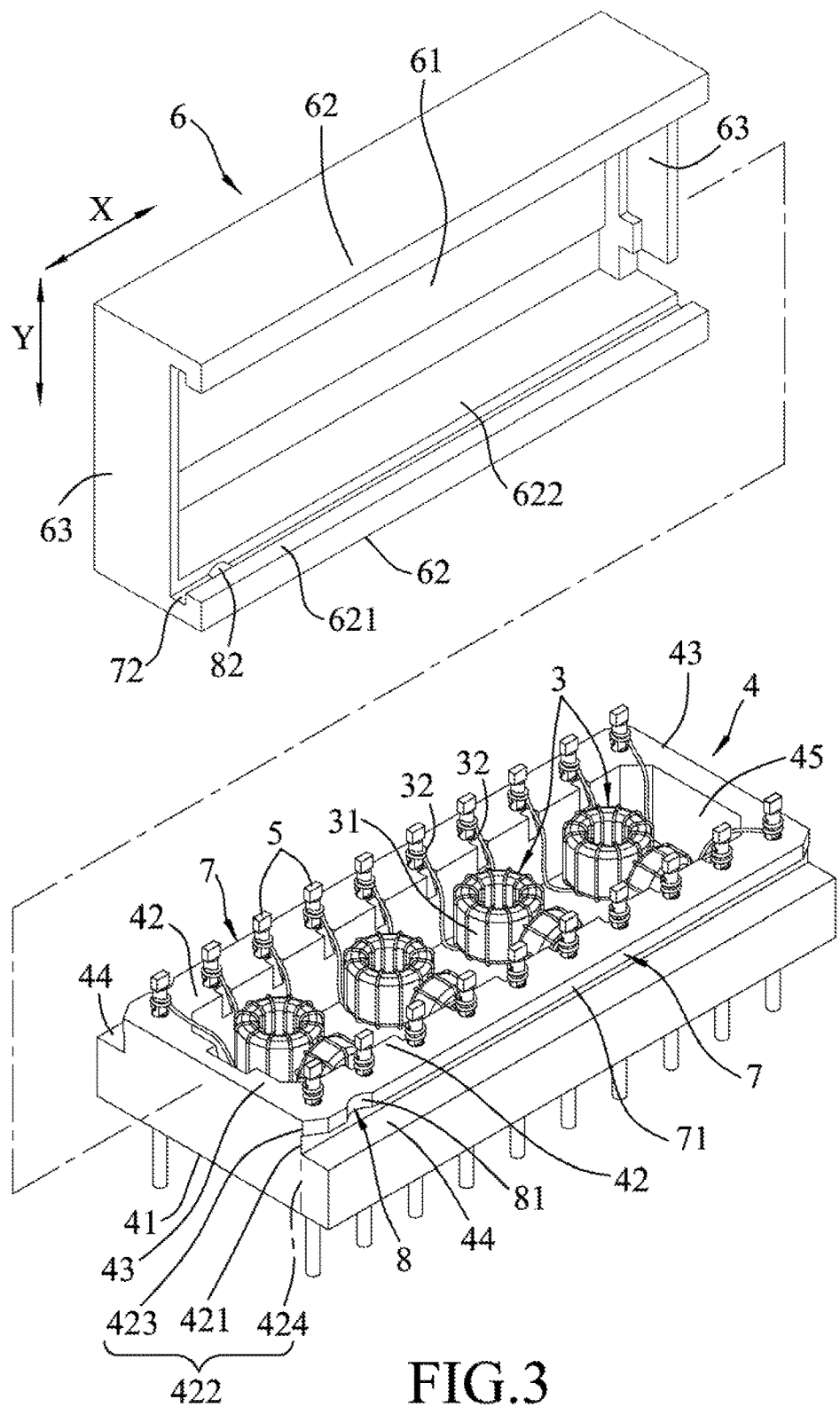
FIG. 3 is a partly exploded perspective view illustrating an embodiment of an electronic device package box according to the disclosure.
Figure 4:
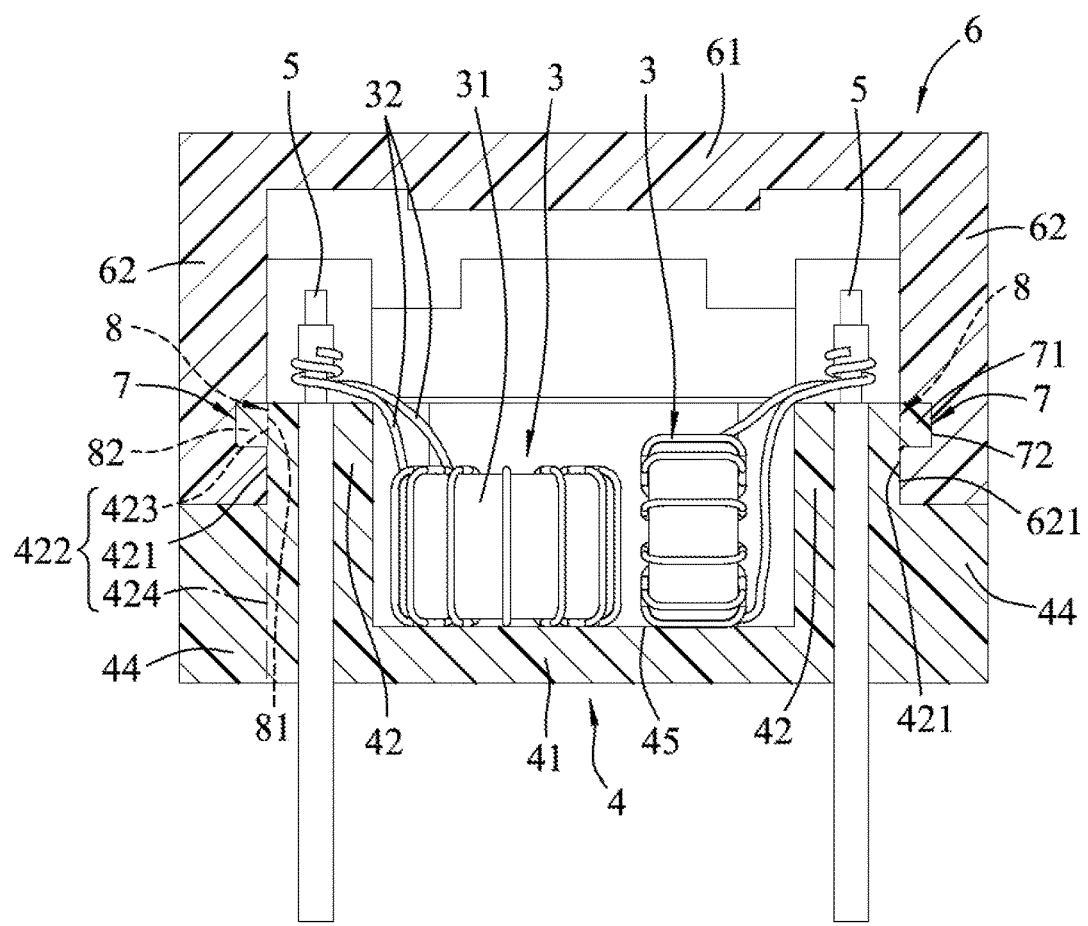
FIG. 4 is a partly cross-sectional view of the embodiment.
Figure 5:
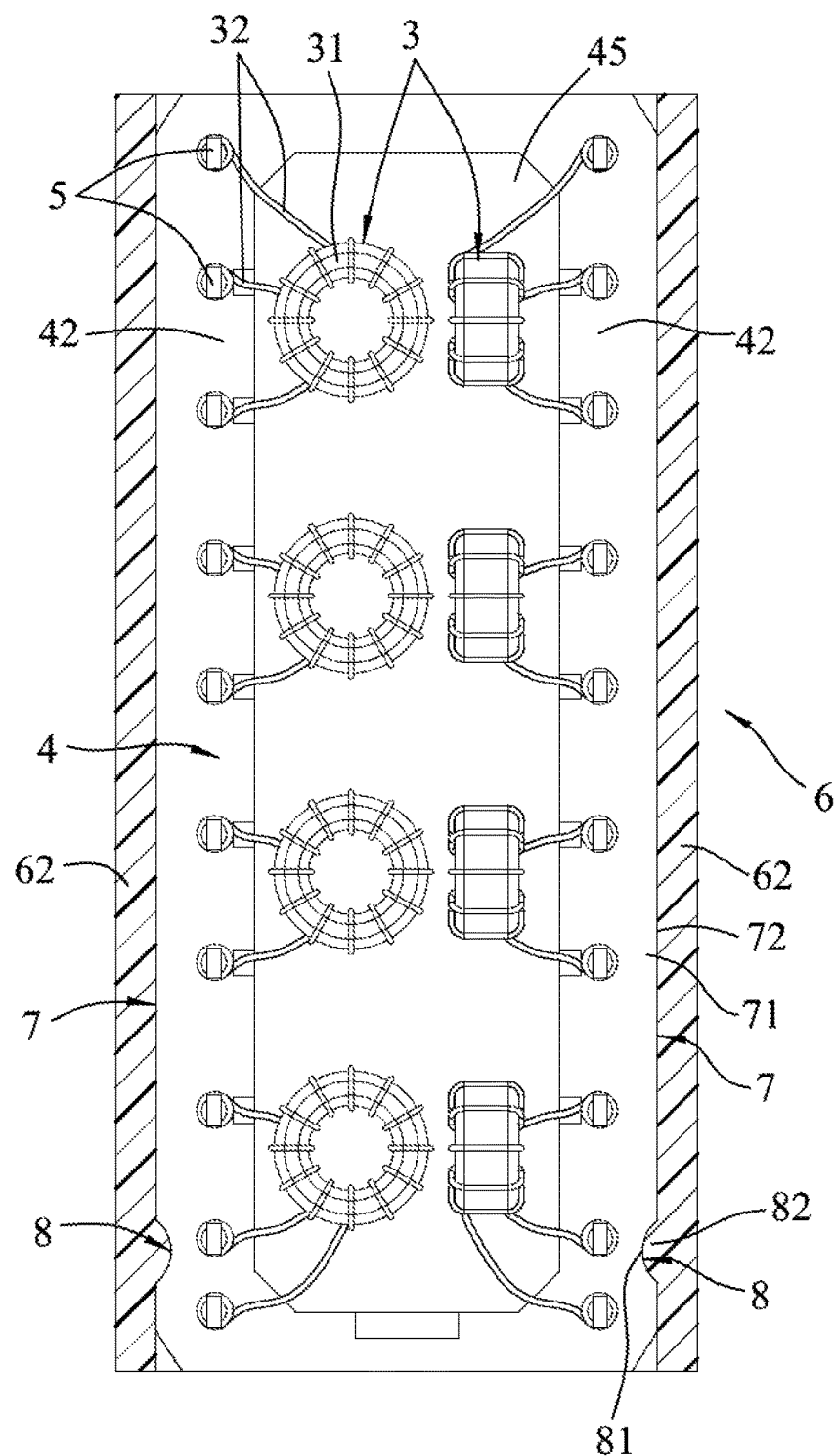
FIG. 5 is a partly cross-sectional top view of the embodiment.

Referring to FIGS. 3 to 5, an embodiment of an electronic device package box according to the present disclosure is adapted to be mounted with a plurality of electric coil components 3. Each of the electronic coil components 3 includes a hollow core 31 and two wires 32 that are wound on the hollow core 31 and that extend outwardly from the hollow core 31. The structure, type, number, arrangement and position of the electronic components 3 are not the essence of the present disclosure and may be changed according to practical requirements, and further elaboration regarding the electronic components 3 will not be provided hereinafter for the sake of brevity.

The electronic device package box includes a base unit 4, a cover unit 6, a plurality of conductive pins 5, two engaging units 7, and two positioning units 8.

The base unit 4 is made of an insulating plastic material, has two first abutment surfaces 421 that are disposed oppositely from each other in a second direction (Y), and defines a receiving space 45 therein for receiving the electric coil components 3.

In this embodiment, the base unit 4 includes a base wall 41, two opposite side walls 42 that extend respectively from two opposite long sides of the base wall 41 toward the cover unit 6, and two opposite end walls 43 that extend respectively from two opposite short sides of the base wall 41 toward the cover unit 6 and that interconnect the side walls. The side walls 42 and the end walls 43 are cooperated to form a rectangular shape. The side walls 42 are separately arranged in the second direction (Y), independently extend in a first direction (X) which is perpendicular to the second direction (Y), and are respectively formed with the first abutment surfaces 421. Each of the side walls 42 has an outer surface 422 facing away from the receiving space 45 and formed with a respective one of the first abutment surfaces 421. In this embodiment, the outer surface 422 of each of the side walls 42 has a bottom portion 424 adjacent to the base wall 41, and a top portion 423 formed with the respective one of the first abutment surfaces 421. The base unit 4 further includes two extending walls 44 each protruding outwardly from the bottom portion 424 of the outer surface 422 of a respective one of the side walls 42 and extending in the first direction (X).

The cover unit 6 is made from an insulating plastic material, removably covers the receiving space 45 of the base unit 4, and has two second abutment surfaces 621 that are disposed oppositely from each other in the second direction (Y) and that respectively abut against the first abutment surfaces 421.

In this embodiment, the cover unit 6 includes a top wall 61, two opposite lateral walls 62 that extend respectively from two opposite long sides of the top wall 61 toward the base unit 4, and two opposite end walls 63 that extend respectively from two opposite short sides of the top wall 61 toward the base unit 4 and that interconnect the lateral walls 62. The lateral walls 62 are separately arranged in the second direction (Y), independently extend in the first direction (X), and are respectively formed with the second abutment surfaces 621. The extending walls 44 of the base unit 4 respectively abut against the lateral walls 62 of the cover unit 6. Each of the lateral walls 62 has an inner surface 622 formed with a respective one of the second abutment surfaces 621. The inner surface 622 of one of the lateral walls 62 faces toward the inner surface 622 of the other one of the lateral walls 62.

The conductive pins 5 are spaced apart from one another, correspondingly mounted in the side walls 42 of the base unit 4, and adapted to be electrically and correspondingly connected to the wires 32 of the electric coil components 3. In certain embodiments, the conductive pins 5 are made from a metal material.

Each of the engaging units 7 includes a first engaging member 71 formed on the respective one of the first abutment surfaces 421, and a second engaging member 72 formed on the respective one of the second abutment surfaces 621. In each of the engaging units 7, the first engaging member 71 is slidable relative to the second engaging member 72 in the first direction (X) so that the base unit 4 is slidably connected to the cover unit 6. In other words, when connected to the base unit 4, the cover unit 6 is able to slide back and forth in the first direction (X). In practice, in each of the engaging units 7, one of the first and second engaging members 71, 72 may be a sliding rail extending in the first direction (X), and the other one of the first and second engaging members 71, 72 may be a groove extending in the first direction (X). In this embodiment, in each of the engaging units 7, the first engaging member 71 is the sliding rail, and the second engaging member 72 is the groove (see FIG. 3).

The positioning units 8 are used for removably positioning the cover unit 6 to the base unit 4. Each of the positioning units 8 includes a first positioning member 81 formed on the first engaging member 71 of a respective one of the engaging units 7, and a second positioning member 82 formed on the second engaging member 72 of the respective one of the engaging units 7. In each of the positioning units 8, the first positioning member 81 is removably and fittingly connected to the second positioning member 82 when the cover unit 6 covers the receiving space 45 of the base unit 4. In practice, in each of the positioning units 8, one of the first and second positioning members 81, 82 may be a recess, and the other one of the first and second positioning members 81, 82 may be a projection that conforms in shape to the recess. In this embodiment, in each of the positioning units 8, the first positioning member 81 is the recess formed on the sliding rail (i.e., the first engaging member 71), and the second positioning member 82 is the projection formed in the groove (i.e., the second engaging member 72) (see FIG. 3). In this embodiment, the recess and the projection are semi-circular for facilitating disconnection of the projection from the recess. It should be noted that the positions of the first and second positioning members 81, 82 may vary based on actual requirements. For example, each of the first positioning members 81 may be formed on a top surface of a respective one of the extending walls 44, and each of the second positioning members 82 may be formed on a bottom surface of a respective one of the lateral walls 62. The top surface of each of the extending walls 44 abuts against the bottom surface of the respective one of the lateral walls 62.

The present disclosure also provides an electronic device that includes the electronic device package box of the embodiment, and a plurality of the electronic coil components 3 that are received in the receiving space 45 of the electronic device package box and that are electrically connected to the conductive pins 5 of the electronic device package box.

When assembling the electronic device package box with the electronic components 3, the electronic components 3 are orderly placed onto the base wall 41 in the receiving space 45. Then, the wires 32 of the electronic components 3 are electrically and correspondingly connected to the conductive pins 5. Since installation of the electronic components 3 is well-known in the art, it is not further elaborated hereinafter. Afterwards, in each of the engaging units 7, the second engaging member 72 is brought into engagement with the first engaging member 71 (i.e., the cover unit 6 is brought into engagement with the base unit 4), followed by sliding the cover unit 6 along the first direction (X) until, in each of the positioning units 8, the first positioning member 81 is removably connected to the second positioning member 82, so that the receiving space 45 is covered with the cover unit 6 (see FIG. 4).

It should be noted that, to open the electronic device package box, a force is applied to the cover unit 6 along the first direction (X) to disengage the second positioning member 82 from the first engaging member 81 of each of the positioning units 8, followed by sliding the cover unit 6 along the first direction (X) to completely disengage the cover unit 6 from the base unit 4. Tools as the ones used in opening the conventional electronic device package boxes 1, 2 are not required to open the electronic device package box of this disclosure.

Furthermore, the shapes, positions and orientations of the first and second engaging members 71, 72 of each of the engaging units 7 may be changed according to practical uses, as long as the cover unit 6 is able to be removably and fittingly connected to the base unit 4. For example, each of the extending walls 44 may be formed with a respective one of the first abutment surfaces 421 on the top surface thereof, and each of the lateral walls 62 may be formed with a respective one of the second abutment surfaces 621 on the bottom surface thereof. In certain embodiments, the extending walls 44 of the base unit 4 may be omitted, and the lateral walls 62 of the cover unit 6 may be further extended toward the base unit 4.

In summary, with the engaging unit 7, the base unit (4) is slidably connected to the cover unit (6), so that the process of assembling and disassembling the electronic device package box of this disclosure can be done without the use of glue or tools as the ones used for the conventional electronic device package boxes 1, 2.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An electronic device package box adapted to be mounted with a plurality of electric coil components, comprising:
   a base unit having a first abutment surface and defining a receiving space therein for receiving the electric coil components;
   a cover unit removably covering said receiving space of said base unit and having a second abutment surface that abuts against said first abutment surface;
   a plurality of conductive pins mounted to said base unit and adapted to be electrically connected to the electric coil components; and
   an engaging unit including a first engaging member formed on said first abutment surface of said base unit, and a second engaging member formed on said second abutment surface of said cover unit, said first engaging member being slidable relative to said second engaging member in a first direction so that said base unit is slidably connected to said cover unit,
   wherein said base unit has two of said first abutment surfaces that are disposed oppositely from each other in a second direction perpendicular to the first direction;
   wherein said cover unit has two of said second abutment surfaces that are disposed oppositely from each other in the second direction and that respectively abut against said first abutment surfaces;
   wherein said electronic device package box comprises two of said engaging units, said first engaging member of each of said engaging units being formed on a respective one of said first abutment surfaces, said second engaging member of each of said engaging units being formed on a respective one of said second abutment surfaces;
   wherein said base unit includes a base wall and two opposite side walls that extend respectively from two opposite sides of said base wall toward said cover unit, said side walls being separately arranged in the second direction, independently extending in the first direction, and being respectively formed with said first abutment surfaces; and
   wherein said cover unit includes a top wall and two opposite lateral walls that respectively extend from two opposite sides of said top wall toward said base unit, said lateral walls being separately arranged in the second direction, independently extending in the first direction, and being respectively formed with said second abutment surfaces.

2. The electronic device package box of claim 1, wherein each of said side walls has an outer surface facing away from said receiving space and being formed with the respective one of said first abutment surfaces, and each of said lateral walls has an inner surface formed with the respective one of said second abutment surfaces, said inner surface of one of said lateral walls facing toward said inner surface of the other one of said lateral walls.

3. The electronic device package box of claim 2, wherein said outer surface of each of said side walls has a bottom portion adjacent to said base wall and a top portion formed with the respective one of said first abutment surfaces, said base unit further including two extending walls each extending outwardly from said bottom portion of said outer surface of a respective one of said side walls, said extending walls respectively abutting against said lateral walls of said cover unit.

4. The electronic device package box of claim 1, wherein, in each of said engaging units, one of said first and second engaging members is a sliding rail extending in the first direction, and the other one of said first and second engaging members is a groove extending in the first direction.

5. The electronic device package box of claim 1, further comprising a positioning unit for removably positioning said cover unit to said base unit.

6. The electronic device package box of claim 5, wherein said positioning unit includes a first positioning member formed on said first engaging member, and a second positioning member formed on said second engaging member, said first positioning member being removably and fittingly connected to said second positioning member when said cover unit covers said receiving space of said base unit.

7. The electronic device package box of claim 6, wherein one of said first and second positioning members is a recess, and the other one of said first and second positioning members is a projection that conforms in shape to said recess.

8. An electronic device, comprising:
   an electronic device package box of claim 1; and
   a plurality of electronic coil components received in said receiving space of said electronic device package box and electrically connected to said conductive pins of said electronic device package box.

* * * * *